(12) United States Patent
Ishihara

(10) Patent No.: US 6,831,031 B2
(45) Date of Patent: Dec. 14, 2004

(54) THERMALLY CONDUCTIVE SHEET

(75) Inventor: Natsuko Ishihara, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 190 days.

(21) Appl. No.: 10/218,057

(22) Filed: Aug. 12, 2002

(65) Prior Publication Data

US 2003/0038278 A1 Feb. 27, 2003

(30) Foreign Application Priority Data

Aug. 17, 2001 (JP) ......................................... 2001-247843

(51) Int. Cl.[7] .......................................... C04B 35/5833
(52) U.S. Cl. ...................... 501/96.4; 524/495; 428/220; 428/332; 428/402; 174/137 B
(58) Field of Search .................. 501/96.4; 524/495, 524/496, 404, 428; 106/415; 428/220, 332, 402; 174/137 B

(56) References Cited

U.S. PATENT DOCUMENTS 6,096,671 A * 8/2000 Kawasaki et al. ......... 501/96.4

FOREIGN PATENT DOCUMENTS

| EP | 1286394 | * | 2/2003 | |
|----|---------|---|--------|---|
| JP | 62-154410 | | 7/1987 | ............. H01B/3/46 |
| JP | 03-151658 | | 6/1991 | ......... H01L/23/373 |
| JP | 05/174623 | | 7/1993 | ............. H01B/3/00 |
| JP | 07-111300 | | 4/1995 | ........... H01L/23/36 |
| JP | 08-244094 | | 9/1996 | ........... B29C/47/14 |
| JP | 11-060216 | | 3/1999 | ......... C01B/21/064 |
| JP | 11-077795 | | 3/1999 | ........... B29C/47/14 |
| JP | 11-156914 | | 6/1999 | ........... B29C/47/04 |
| JP | 2000-108220 | | 4/2000 | ........... B29D/22/00 |

* cited by examiner

*Primary Examiner*—Mark Kopec
(74) *Attorney, Agent, or Firm*—Fish & Richardson P.C.

(57) ABSTRACT

A thermally conductive sheet comprising boron nitride powder as a first thermally conductive filler dispersed into an organic matrix, wherein the boron nitride powder is hexagonal boron nitride (h-BN), and comprises primary particles and secondary aggregates formed by aggregation of the primary particles, wherein at least part of the secondary aggregates being 50 μm or more in size. The boron nitride powder preferably includes 1 to 20 percent by weight of secondary aggregates of 50 μm or more in size. The organic matrix material is preferably silicone rubber.

14 Claims, 1 Drawing Sheet

THERMALLY CONDUCTIVE SHEET

CROSS REFERENCE TO RELATED APPLICATIONS

Pursuant to 35 USC §119, this application claims the benefit of Japan Patent Application No. 2001-247843 filed Aug. 17, 2001.

BACKGROUND OF THE INVENTION

The present invention relates to a thermally conductive sheet having excellent thermal conductivity. Specifically, it relates to a thermally conductive sheet having both of excellent thermal conductivity and electric insulation performance, which effectively dissipates heat generated in various semiconductor devices, power supply, light source, parts or the like to outside the electrical apparatus.

To dissipate heat generated by various electronic parts in electrical apparatus (for example, exothermic electronic parts such as transistor and thyristor), heat-radiating members such as heat sink are conventionally attached to the exothermic parts through a thermally conductive sheet having good thermal conductivity. This thermally conductive sheet serves to reduce contact thermal resistance between the exothermic electronic parts and the heat-radiating member to conduct efficiently the heat generated in the exothermic electronic parts to the heat-radiating member.

As a thermally conductive sheet having good thermal conductivity, a sheet is generally known in which thermally conductive fillers having large thermal conductivity, such as metals, ceramics, and carbon fibers, are dispersed in an organic matrix. Such a kind of thermally conductive sheet is usually formed by dispersing thermally conductive fillers in an organic matrix, then molding the resultant mixed composition into a sheet by well-known molding techniques, such as a press molding, injection molding, extrusion molding, calendering, roll forming, and doctor blade molding.

In recent years, in high-performance electronic apparatuses, such as notebook type personal computers and mobile phones, the amount of heat generation in various electronic parts increases as electronic apparatuses are provided with higher integration, higher speeds, smaller sizes, and less weights. Thus, the need is growing more and more for thermally conductive sheet having still higher thermal conductivity. To meet such a need, various thermally conductive sheets are proposed in which boron nitrides (BN) with excellent thermal conductivity and electric insulation performance, especially hexagonal boron nitride (h-BN) having high thermal conductivity after BeO in ceramic materials, is dispersed in an organic matrix as thermally conductive filler.

It is known that hexagonal boron nitride have a crystal structure of a lamellar structure stacked with hexagonal network planes similar to graphite, and its particle is in a form of a flake due to its manufacturing process. This cause hexagonal boron nitride to have anisotropy in thermal conductivity. That is, hexagonal boron nitride powder has a feature that a thermal conductivity in a direction along the plane of a flaky particle is dozens times higher than a thermal conductivity in the thickness direction.

Therefore, it is expected to obtain a thermally conductive sheet whose thermal conductivity in the sheet thickness direction is greatly improved by dispersing the hexagonal boron nitride powder into an organic matrix so that planes of flaky particles of the powder are oriented along the sheet thickness direction.

However, as shown in FIG. 2, in the thermal conductive sheet molded by commonly well-known molding methods above mentioned, the planes of flaky particles of hexagonal boron nitride powder 23 tends to oriented in an organic matrix 22 so as to be parallel relative to the sheet surface by pressure and flow when molding. As a result, a thermally conductive sheet 21 obtained in this way has an excellent thermal conductivity in a parallel direction relative to the sheet surface. Accordingly, such thermally conductive sheet has a disadvantage that it cannot fully demonstrate an excellent thermal conductivity of the hexagonal boron nitride in applications where a thickness direction of sheet serves as a heat conduction path.

For above applications, various methods for orienting the boron nitride powder dispersed into an organic matrix material so that planes of the flaky particles are parallel relative to a sheet thickness direction are proposed.

For example, following methods are disclosed: in Japanese Patent Laid-Open No. 62-154410, a method in which boron nitride powder is randomly oriented in a sheet by using ultrasonic shaking machine; in Japanese Patent Laid-Open No. 3-151658, methods in which a heat-radiating sheet is formed by slicing a extruded sheet with boron nitride oriented in a fixed direction or by pre-forming to orient the filler and molding the preformed sheet; in Japanese Patent Laid-Open No. 5-174623, a method in which boron nitride powder is oriented by gravity and electrostatic force, and in Japanese Patent Laid-Open No. 7-111300, a method in which particle thickness of boron nitride powder is specified to 1 $\mu$m or more. Moreover, Japanese Patent Laid-Open No. 8-244094 describes a method in which a plurality of plastic bands where hexagonal boron nitride powder is oriented in a fixed direction by extruding are integrated into a sheet by means of a die lip; Japanese Patent Laid-Open No. 11-77795 describes a method to form a rubber sheet in which a plurality of belt-like sheets is extruded by using a die with slits and combined together, and then the combined material is sliced in vertical direction relative to its thickness; Japanese Patent Laid-Open No. 11-156914 also describes a method in which a plurality of belt-like moldings are extruded using a first and a second molds having cavernous block structure in two steps and then bundled together in order to improve the degree of desired orientation in boron nitride powder; and Japanese Patent Laid-Open No. 2000-108220 proposes a method in which two or more of non-cured cylindrical moldings oriented by extruding is bundled with gaps to be pores.

Since each of these methods, however, requires special equipment or complicated manufacturing process, they are disadvantageous in respect of productivity or cost, and also limit a degree of freedom for thickness of sheets in design.

On the other hand, Japanese Patent Laid-Open No. 11-60216 proposed a thermally conductive sheet whose thermal conductivity in sheet thickness direction is improved by blending boron nitride powder having a specific degree of aggregation into an organic matrix. According to this proposal, special equipment or complicated manufacturing process becomes unnecessary, and a thermally conductive sheet having thermal conductivity excellent in sheet thickness direction can be obtained simply and at low cost.

However, since boron nitride powder used above has low wettability to an organic matrix due to their large specific surface area, there was a disadvantage that such powder could not be loaded with high concentration into the organic matrix. High level loading of such boron nitride powder with low wettability into the organic matrix requires addition of solvent, and consequently additional processes, such as solvent elimination.

To deal with the disadvantages abovementioned, an object of the present invention is to provide a thermally conductive sheet that has an excellent thermal conductivity in sheet thickness direction, and that can be simply produced with high productivity at low cost.

BRIEF SUMMARY OF THE INVENTION

The present invention provides a thermally conductive sheet comprising boron nitride powder as a first thermally conductive filler dispersed into an organic matrix, wherein the boron nitride powder is hexagonal boron nitride (h-BN), and comprises primary particles and secondary aggregates formed by aggregation of the primary particles, wherein at least part of the secondary aggregates is 50 μm or more in size. The secondary aggregates of 50 μm or more in size are preferably contained in the boron nitride powder with 1 to 20 percent by weight.

The present invention also covers a mixed composition comprising boron nitride powder as a first thermally conductive filler dispersed into an organic matrix, wherein the boron nitride powder is hexagonal boron nitride (h-BN), and comprises primary particles and secondary aggregates formed by aggregation of the primary particles, wherein at least part of the secondary aggregates are 50 μm or more in size.

Other aspects and advantages of the invention will become apparent from the following description, taken in conjunction with the accompanying drawings, illustrating by way of example the principles of the invention.

BRIEF DESCRIPTION OF THE SEVERAL VIEWS OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
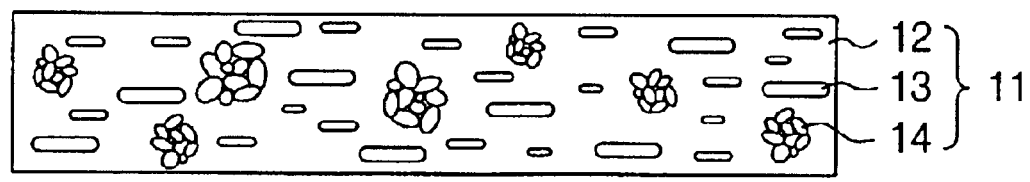
FIG. 1 shows a sectional view of a thermally conductive sheet of the present invention.

Hereinafter, one embodiment of the present invention will be described in detail.

A thermally conductive sheet according to the present invention comprises a boron nitride powder dispersed into an organic matrix as thermally conductive filler, wherein the boron nitride powder is hexagonal boron nitride (h-BN) including primary particles and secondary aggregates formed by aggregation of the primary particles, wherein at least part of the secondary aggregates is 50 μm or more in size.

The organic matrix material is not especially limited, and may be suitably selected from well-known organic matrix materials, for example, thermoplastic resins, thermoplastic elastomers, curable resins, cross-linked rubbers according to required performances of a desired thermally conductive sheet, such as mechanical, thermal, and electrical properties, durability, or reliability.

The organic matrix includes, but not limited to, silicone rubbers, epoxy resins, polyurethane resins, fluorine based rubbers. Especially, it is most preferable to use silicone rubbers having low hardness, excellent flexibility, shape conformance, workability, electric insulation performance, heat resistance, and small temperature dependency for physical properties value.

Silicone rubbers are produced by curing well-known polyorganosiloxanes. Curing types of such silicone rubbers include, for example, radical reaction type by organic peroxides; addition reaction type by polyorganosiloxane having vinyl groups, organo-hydrogens having hydrogen atoms bonded with silicon atoms, and platinum based catalysts; and condensation reaction type, but not limited to them. In consideration of a surface hardness and a flexibility of sheets, it is preferable to use addition reaction type liquid silicone rubbers.

In addition, flame retarders, colorants, heat-resistant improvers, adhesion auxiliary agents, adhesives, plasticizers, oils, and curing retarders may be added into the organic matrix, if needed.

Boron nitride powder used in the present invention is sintered powder of hexagonal boron nitride (h-BN), and preferably includes 1 to 20 percent by weight of secondary aggregates of 50 μm or more in size. More specifically, this hexagonal boron nitride powder is a mixture comprising flaky particles (referred to as "primary particles") of hexagonal boron nitride obtained by conventional producing method, and secondary aggregates that are formed by aggregation of the primary flaky particles. The mixture includes 1 to 20 percent by weight of secondary aggregates of 50 μm or more in size. The secondary aggregate means an aggregated unit formed by aggregation of primary flaky particles of the boron nitride orienting in random direction, respectively.

Although a mean particle size of the primary particles of the boron nitride powder is not especially limited, it is preferably in the range of 0.01 to 100 μm, and more preferably in the range of 1 to 50 μm. When a mean particle size of the primary particles is less than 0.01 μm, the powder becomes difficult to be loaded into an organic matrix with high concentration. And when a mean particle size of the primary particles of the boron nitride powder exceeds 100 μm, such powder becomes difficult to be manufactured and may be costly. In addition, the primary particles generally has a flaky shape, however, it may have flat, granule, mass, globular, fiber, or whisker shapes.

Aggregation type of the secondary aggregates may be, but not limited to, for example, a natural aggregation caused by van der Waals force, electrostatic force, and adsorption moisture, or an intentional aggregation obtained by using flocculate comprising mineral salts or polymers, mixing granulation, extruding granulation, and spray drying. The secondary aggregates also may be formed by aggregation of impurities such as $B_2O_3$ produced in manufacturing process of boron nitride to particle boundary.

The content of the secondary aggregates of 50 μm or more in size is preferably in the range of 1 to 20 percent by weight, and more preferably in the range of 3 to 15 percent by weight of the boron nitride powder. When content of the secondary aggregates of 50 μm or more in size is less than 1 percent by weight of the boron nitride powder, even if an amount of blending of boron nitride powder in the thermal conductive sheet is increased, a thermal conductivity in the sheet thickness direction cannot be improved. On the other hand, a content exceeding 20 percent by weight of secondary aggregate 50 μm or more in size makes kneading the boron nitride powder into an organic matrix material difficult, causing uniform dispersion into the organic matrix material to be impossible.

The boron nitride powder also may include secondary aggregate of less than 50 μm in size in remainder, as long as the powder includes secondary aggregates of 50 μm or more in size with 1 to 20 percent by weight.

Since the particle size of the primary particles is more preferably in the range of 0.01 to 50 μm as mentioned above, when a size of secondary aggregates is at least 50 μm or more, it is considered that the secondary aggregate may be formed by at least two or more primary particles having the above preferable particle size. The size of secondary aggregates depends on the particle size and degree of aggregation of the primary particles, and is not especially limited as long as it is 50 μm or more. However, it is required that a secondary aggregate size should be less than a thickness of thermally conductive sheet to be molded. When a secondary aggregate size is not less than thickness of the thermally conductive sheet molded, the sheet surface may be uneven, and flat and smooth surface cannot be obtained. This may cause the sheet to have poor adhesion of the sheet with exothermic electronic parts and heat-radiating member.

The thermally conductive sheet may be formed by molding a mixed composition into a sheet. In the mixed composition, boron nitride powder is dispersed into an organic matrix. The molding method for this thermally conductive sheet is not especially limited, and well-known molding methods, such as press molding, injection molding, extrusion molding, calender molding, roll forming, and doctor blade molding, may be suitably used.

The amount of blending of the boron nitride powder in the sheet is not especially limited. However, it is preferably 50 to 300 parts by weight, and more preferably 100 to 200 parts by weight, per 100 parts by weight of an organic matrix material. When an amount of blending of boron nitride powder in the sheet is less than 50 parts by weight, a thermal conductivity of the sheet obtained may be insufficient to attain high thermal conductivity expected. On the other hand, when an amount of blending of boron nitride powder is more than 300 parts by weight, uniform dispersion of the boron nitride powder into an organic matrix material will be difficult. As a result, a viscosity of the mixed composition will increase, thereby unsuitably impairing its operability and molding workability.

To improve wettability and peel strength of the boron nitride powder with an organic matrix material, a surface treatment, such as by coupling agents, may be applied to the boron nitride powder. This treatment can attain high-concentration loading of the boron nitride powder in an organic matrix, further improving the thermal conductivity of the thermal conductive sheet. When the organic matrix is silicone rubber, coupling agents to be used include, for example, coupling agents, such as silane based, titanate based, and aluminate based agents. However, since coupling agents, such as some of silane based, titanate based, and aluminate based agents may prevent the silicone rubber from curing, they should be carefully selected to be used.

A method of the surface treatment by the coupling agents is not especially limited, and may include, for example, a dry (agitating) process using Henschel-type mixer, V-type blender, etc.; wet process in which filler is added into a coupling agent solution, then agitated, filtrated, and dried; integral blending in which coupling agent is added when kneading of an organic matrix material and thermally conductive filler; and a mechanochemical process, which is performed while grinding the filler by ball mill or jet mill. In addition, in order to improve reactivity between the boron nitride powder and coupling agents, the boron nitride powder may be subjected to a degreasing process, a cleaning process, or surface treatments, such as oxidation treatment by electrolytic oxidation, UV irradiation treatment, corona treatment, and primer applying treatment.

Although a thickness of the thermally conductive sheet is not especially limited, it may be preferably in the range of 100 μm to 10 mm, and more preferably in the range of 200 μm to 5 mm. When a thickness of the thermally conductive sheet is thinner than 100 μm, manufacturing and handling become difficult. On the other hand, when a thickness of thermally conductive sheet is thicker than 10 mm, a thermal resistance of the sheet will unsuitably increase.

According to the present embodiment, the following advantages can be obtained.

Use of hexagonal boron nitride powder having excellent thermal conductivity and electric insulation performance as a thermally conductive filler can provide a thermally conductive sheet having both of excellent thermal conductivity and electric insulation performance. Such a thermally conductive sheet is applicable in recent high-performance electronic apparatus that is highly integrated, improved in speed, and miniaturized and light-weighted.

Use of hexagonal boron nitride powder including secondary aggregates of 50 μm or more in size can improve a thermal conductivity of the thermally conductive sheet in the sheet thickness direction. In particular, a secondary aggregate is formed by aggregation of primary flaky particles of hexagonal boron nitride respectively oriented in random direction. Thus, some of primary flaky particles included in the second aggregates may be oriented so that their direction exhibiting higher thermal conductivity may be parallel relative to the sheet thickness direction. Therefore, a nature of the primary particles, which they have extremely higher thermal conductivity in one direction, can improve a thermal conductivity in a sheet thickness direction, thereby providing a thermally conductive sheet which has excellent thermal conductivity in its thickness direction.

When hexagonal boron nitride powder includes 1 to 20 percent by weight of secondary aggregates of 50 μm or more in size, the powder may have a suitable particle size distribution as thermally conductive filler to be dispersed into an organic matrix, and good wettability to organic matrix materials, resulting in high level loading of the filler into the organic matrix. Therefore, the conventional process of adding solvents for increasing the amount of the boron nitride powder loaded into an organic matrix may not be required. Consequently, a process for eliminating solvents also may not be necessary. As a result, manufacturing of a thermally conductive sheet having excellent thermal conductivity will be simple and at low cost. Especially, by using as thermally conductive filler hexagonal boron nitride powder including 3 to 15 percent by weight secondary aggregates of 50 μm or more in size, a high-performance thermally conductive sheet with high thermal conductivity and low thermal resistance in the sheet thickness direction can be obtained.

This thermally conductive sheet may be simply manufactured by processes in which a mixed composition with boron nitride powder dispersed into an organic matrix is molded into a sheet. Since the conventional process of orienting the boron nitride powder by special equipment or complicated manufacturing process as abovementioned becomes unnecessary, the sheet may be manufactured simply and at low cost.

By using silicone rubbers having a low hardness and excellent flexibility and shape conformance as an organic matrix, the thermal conductive sheet obtained can be closely mounted on electronic parts so as to conform to irregularities of mounted portions, and then may be applicable for various mounting style. This close mounting of the thermally conductive sheet on the electronic parts can provide a wide contact area, which may effectively conduct heat generated by exothermic parts to outside. Furthermore, use of silicone rubbers having small temperature dependency for physical properties and better electric insulation performance and heat resistance can provide a thermally conductive sheet that has both of excellent thermal conductivity and electric insulation performance and may be applicable in recent high-performance electronic apparatus highly integrated, improved in speed, miniaturized, and light-weighted.

EXAMPLES

Although the above described embodiments will be described further in detail hereinafter with reference to Examples and Comparative Examples, this description is not intended to limit the range of the present invention.

Example 1

140 parts by weight of Hexagonal boron nitride powder (manufactured by KCM Corporation) including 4 percent by weight secondary aggregates of 50 μm or more in size as a thermally conductive filler was blended to 100 parts by weight of an addition reaction type liquid silicone rubber (manufactured by GE Toshiba Silicones) as an organic matrix, and kneaded to obtain a mixed composition. The mixed composition was molded by press molding into a sheet to produce a thermally conductive sheet having a thickness of 0.5 mm.

As shown in FIG. 1, in the resultant thermally conductive sheet 11, primary flaky particles 13 of hexagonal boron nitride and secondary aggregates 14 of 50 μm or more in size were dispersed into an organic matrix material 12.

Example 2

140 parts by weight of Hexagonal boron nitride powder (manufactured by KCM Corporation) including secondary aggregates of 50 μm or more in size with 7 percent by weight as a thermally conductive filler was blended to 100 parts by weight of an addition reaction type liquid silicone rubber (manufactured by GE Toshiba Silicones) as an organic matrix material, and kneaded to obtain a mixed composition. The mixed composition was molded by press molding into a sheet to produce a thermally conductive sheet having a thickness of 0.5 mm.

In the resultant thermally conductive sheet 11, primary flaky particles 13 of hexagonal boron nitride and secondary aggregates 14 of 50 μm or more in size were dispersed into an organic matrix material 12 as like Example 1.

Example 3

140 parts by weight of Hexagonal boron nitride powder (manufactured by KCM Corporation) including 14 percent by weight secondary aggregates of 50 μm or more in size as a thermally conductive filler was blended to 100 parts by weight of an addition reaction type liquid silicone rubber (manufactured by GE Toshiba Silicones) as an organic matrix material, and kneaded to obtain a mixed composition. The mixed composition was molded by press molding into a sheet to produce a thermally conductive sheet having a thickness of 0.5 mm.

In the resultant thermally conductive sheet 11, primary flaky particles 13 of hexagonal boron nitride and secondary aggregates 14 of 50 μm or more in size were dispersed into an organic matrix material 12 as like Example 1.

Example 4

140 parts by weight of Hexagonal boron nitride powder (manufactured by KCM Corporation) including 19 percent by weight secondary aggregates of 50 μm or more in size as a thermally conductive filler was blended to 100 parts by weight of an addition reaction type liquid silicone rubber (manufactured by GE Toshiba Silicones) as an organic matrix material, and kneaded to obtain a mixed composition. The mixed composition was molded by press molding into a sheet to produce a thermally conductive sheet having a thickness of 0.5 mm.

In the resultant thermally conductive sheet 11, primary flaky particles 13 of hexagonal boron nitride and secondary aggregates 14 of 50 μm or more in size were dispersed into an organic matrix material 12 as like Example 1.

Comparative Example 1

140 parts by weight of Hexagonal boron nitride powder (manufactured by KCM Corporation) without secondary aggregates of 50 μm or more in size as a thermally conductive filler was blended to 100 parts by weight of an addition reaction type liquid silicone rubber (manufactured by GE Toshiba silicones) as an organic matrix material, and kneaded to obtain a mixed composition. The mixed composition was molded by press molding into a sheet to produce a thermally conductive sheet having a thickness of 0.5 mm.

Figure 2:
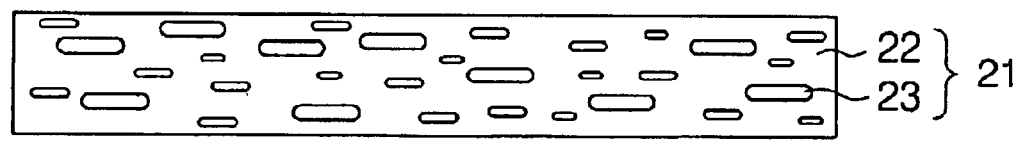
FIG. 2 shows a sectional view of a conventional thermally conductive sheet.

As shown in FIG. 2, in the resultant thermally conductive sheet 21, only primary flaky particle of hexagonal boron nitride powder 23 was dispersed into an organic matrix material 22.

Comparative Example 2

140 parts by weight of hexagonal boron nitride powder (manufactured by KCM Corporation) including 25 percent by weight secondary aggregates of 50 μm or more in size as thermally conductive filler was blended to 100 parts by weight of an addition reaction type liquid silicone rubber (manufactured by GE Toshiba Silicones) as an organic matrix material, and tried to knead to obtain a mixed composition, however, failed to disperse the hexagonal boron nitride powder into the organic matrix evenly.

Table 1 shows thermal conductivities and thermal resistances in the sheet thickness direction of the thermally conductive sheets obtained in Examples and Comparative Examples above-mentioned.

TABLE 1

| | Ex.1 | Ex.2 | Ex.3 | Ex.4 | Comp. 1 | Comp. 2 |
|---|---|---|---|---|---|---|
| Content of secondary aggregates of ≧ 50 μm (wt %) | 4 | 7 | 14 | 19 | 0 | 25 |
| Kneading property | good | good | good | good | good | * |
| Thermal conductivity (W/(m · K)) | 3.0 | 3.2 | 3.5 | 3.8 | 2.5 | — |
| Thermal resistance (° C./W) | 0.16 | 0.14 | 0.11 | 0.10 | 0.19 | — |

*Kneading impossible

A thermal conductivity of each thermally conductive sheet was measured using a laser flash method heat constant measuring apparatus (LF/TCM-FA8510B, manufactured by Rigaku Corporation, test temperature: 25° C.). The thermal resistances of the thermally conductive sheets in FIG. 1 was obtained as follow: a thermally conductive sheet (specimen of 5 cm×5 cm) was fixed between a heater and a heat sink with a cooling fan under a constant load, then the heater was heated with a fixed electric power, and subsequently after 10 minutes a heater temperature and a heat sink temperature were measured, and then a thermal resistance was calculated by dividing a difference between the two temperatures by power consumption. Therefore, the thermal resistance calculated shows a difference of temperature between a heater temperature and a heat sink temperature generated when electric power of 1 Watt was consumed. That is, smaller value of this thermal resistance shows that heat can be conducted more efficiently in the sheet thickness direction.

As obviously in Table 1, kneading property of hexagonal boron nitride powder and an organic matrix material was good in Example 1 to Example 4, and in Comparative Example 1. On the other hand, the boron nitride powder and organic matrix material were not able to be kneaded in Comparative Example 2 in which the boron nitride powder including 25 percent by weight secondary aggregates of 50 $\mu$m or more in size was used.

The thermally conductive sheets obtained in Example 1 to Example 4 exhibit excellent thermal conductivity of 3.0 (W/(m·K) or more in the sheet thickness direction. Furthermore, the thermally conductive sheets of Example 1 to Example 4 also have low thermal resistance in the sheet thickness direction. From these results, it is confirmed that the thermally conductive sheets according to the present invention can effectively conduct heat in the thickness of the sheet. Contrastively, the thermally conductive sheet of Comparative Example 1 exhibits low thermal conductivity in the sheet thickness direction of 2.5 W/(m·K), and high thermal resistance in the sheet thickness direction.

The present invention is not limited to the above described embodiments and constitution of Examples, and constitution of each part may be modified arbitrarily to embody the invention without departing from the spirit and scope of the invention.

For example, at least one reinforcement layer, such as network materials, textile fabrics, non-woven fabrics, and films, may be provided on a surface and/or inside of a thermally conductive sheet in order to improve a mechanical strength of the thermally conductive sheet. Alternatively, reinforcement fillers, such as silica powder, may be blended into an organic matrix material for the purpose of the same.

Other thermally conductive fillers with large thermal conductivity may be blended into an organic matrix in order to obtain much higher thermal conductivity. The other thermally conductive fillers may include cubic boron nitrides (c-BN), aluminum oxides, aluminum hydroxides, aluminum nitrides, magnesium oxides, silicon nitrides, silicon carbides, and any combination thereof, and they may be used solely or in combination.

It should be apparent to those skilled in the art that the present invention may be embodied in many other specific forms without departing from the spirit or scope of the invention. Particularly, it should be understood that the invention may be embodied in the following forms.

Therefore, the present examples and embodiments are to be considered as illustrative and not restrictive and the invention is not to be limited to the details given herein, but may be modified within the scope and equivalence of the appended claims.

What is claimed is:

1. A thermally conductive sheet comprising boron nitride powder as a first thermally conductive filler dispersed into an organic matrix, wherein the boron nitride powder is hexagonal boron nitride (h-BN), and comprises primary particles and secondary aggregates formed by aggregation of the primary particles, and 1 to 20 percent by weight of the boron nitride powder is secondary aggregates of 50 $\mu$m or more in size.

2. The thermally conductive sheet according to claim 1, wherein the organic matrix material is silicone rubber.

3. The thermally conductive sheet according to claim 1, wherein at least one reinforcement layer is provided at least on a surface of the sheet and inside of the sheet.

4. The thermally conductive sheet according to claim 3, wherein the reinforcement layer comprises at least one of network materials, textile fabrics, non-woven fabrics, and films.

5. The thermally conductive sheet according to claim 1, wherein the organic matrix further includes reinforcement filler.

6. The thermally conductive sheet according to claim 5, wherein the reinforcement filler comprises silica powder.

7. The thermally conductive sheet according to claim 1, wherein the organic matrix further includes a second thermally conductive filler that is different from the first thermally conductive filler.

8. The thermally conductive sheet according to claim 7, wherein the second thermally conductive filler comprises at least one of cubic boron nitrides (c-BN), aluminum oxides, aluminum hydroxides, aluminum nitrides, magnesium oxides, silicon nitrides, and silicon carbides.

9. A mixed composition comprising boron nitride powder as a first thermally conductive filler dispersed into an organic matrix, wherein the boron nitride powder is hexagonal boron nitride (h-BN), and comprises primary particles and secondary aggregates formed by aggregation of the primary particles, and 1 to 20 percent by weight of the boron nitride powder is secondary aggregates 50 $\mu$m or more in size.

10. The mixed composition according to claim 9, wherein the organic matrix material is silicone rubber.

11. The mixed composition according to claim 9, wherein the organic matrix further includes reinforcement filler.

12. The mixed composition according to claim 11, wherein the reinforcement filler comprises silica powder.

13. The mixed composition according to claim 9, wherein the organic matrix further includes a second thermally conductive filler that is different from the first thermally conductive filler.

14. The mixed composition according to claim 13, wherein the second thermally conductive filler comprises at least one of cubic boron nitrides (c-BN), aluminum oxides, aluminum hydroxides, aluminum nitrides, magnesium oxides, silicon nitrides, and silicon carbides.

* * * * *